US012645853B2

(12) United States Patent
Hossain et al.

(10) Patent No.: US 12,645,853 B2
(45) Date of Patent: Jun. 2, 2026

(54) PROGRAMMABLE INPUT AND OUTPUT INTERFACES IN PROCESSING INTEGRATED CIRCUITS FOR SERVERS AND OTHER DEVICES

(71) Applicant: Intel Corporation, Santa Clara, CA (US)

(72) Inventors: Md Altaf Hossain, Portland, OR (US); Mahesh Kumashikar, Bangalore (IN); Ankireddy Nalamalpu, Portland, OR (US); Sreedhar Ravipalli, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 18 days.

(21) Appl. No.: 17/950,728

(22) Filed: Sep. 22, 2022

(65) Prior Publication Data

US 2023/0018793 A1    Jan. 19, 2023

(51) Int. Cl.
*G06F 30/327* (2020.01)

(52) U.S. Cl.
CPC .................................. *G06F 30/327* (2020.01)

(58) Field of Classification Search
CPC ................................................... G06F 30/327
USPC ......................................................... 716/102
See application file for complete search history.

(56) References Cited

U.S. PATENT DOCUMENTS 6,560,665 B1 * 5/2003 Resler ................. G06F 15/7814
                                                710/305
6,825,689 B1 * 11/2004 Snyder ................ G06F 13/4072
                                                326/38

7,168,061 B2 * 1/2007 Roesner .................. G06F 30/30
                                                703/15
7,272,810 B2 * 9/2007 Orita ...................... G06F 30/394
                                                716/120
7,281,233 B1 * 10/2007 Sivasubramaniam .. G06F 30/34
                                                716/137
7,386,825 B2 * 6/2008 Roesner .................. G06F 30/33
                                                716/139
7,426,461 B2 * 9/2008 Nelson .................... G06F 30/33
                                                716/101
7,890,917 B1 * 2/2011 Young ...................... G06F 30/34
                                                716/117
7,949,915 B2 * 5/2011 Chakraborty .. G01R 31/318533
                                                714/724
7,958,479 B2 * 6/2011 Chakraborty ......... G06F 11/267
                                                716/114
8,402,409 B1 * 3/2013 Janneck .................... G06F 8/30
                                                717/136
9,032,358 B2 * 5/2015 Srinivas ................. H10D 89/10
                                                716/137
9,075,945 B1 * 7/2015 Ventelae ................. G06F 30/34
9,805,152 B1 * 10/2017 Carrillo ................ G06F 30/327
9,952,282 B1    4/2018 Kutz et al.

(Continued)

FOREIGN PATENT DOCUMENTS

CN          119311504 A  *  1/2025  .......... G06F 30/327

*Primary Examiner* — Suresh Memula

(74) *Attorney, Agent, or Firm* — InventIQ Legal LLP; Steven J. Cahill

(57) ABSTRACT

A processing integrated circuit includes a processing core comprising hard logic circuits and a programmable interface circuit configurable to exchange signals between an external terminal of the processing integrated circuit and the hard logic circuits in the processing core.

20 Claims, 4 Drawing Sheets

(56)     References Cited

U.S. PATENT DOCUMENTS

| | | | |
|---|---|---|---|
| 10,140,242 B2 | 11/2018 | Mishra et al. | |
| 10,241,953 B2 | 3/2019 | Mishra et al. | |
| 10,303,648 B1 * | 5/2019 | Das | G06F 9/3897 |
| 10,503,861 B1 * | 12/2019 | Gaitonde | G06F 30/327 |
| 2007/0180423 A1 * | 8/2007 | Hunt | G06F 30/30 |
| | | | 716/102 |
| 2013/0009314 A1 * | 1/2013 | Ogawa | G06F 30/39 |
| | | | 257/E23.068 |
| 2014/0365987 A1 * | 12/2014 | Kumar | G06F 30/392 |
| | | | 716/120 |
| 2015/0109024 A1 * | 4/2015 | Abdelfattah | H03K 19/017581 |
| | | | 326/41 |
| 2015/0229310 A1 * | 8/2015 | Chang | H03K 19/17756 |
| | | | 326/38 |
| 2018/0088912 A1 * | 3/2018 | Ogami | G06F 9/22 |
| 2018/0144085 A1 * | 5/2018 | Liu | G06F 30/394 |

* cited by examiner

PROGRAMMABLE INPUT AND OUTPUT INTERFACES IN PROCESSING INTEGRATED CIRCUITS FOR SERVERS AND OTHER DEVICES

FIELD OF THE DISCLOSURE

The present disclosure relates to electronic integrated circuits, and more particularly, to programmable input/output interface circuits and methods in processing integrated circuits for servers and other devices.

BACKGROUND

A microprocessor integrated circuit (IC) is a monolithic electronic device. A microprocessor IC typically includes arithmetic and control logic circuits that perform functions of a central processing unit for a computing system. A microprocessor IC can interpret and execute program instructions and can perform arithmetic operations. A microprocessor IC receives input data and processes the input data according to the program instructions to generate output. A microprocessor IC can, for example, include combinational logic circuits and/or sequential logic circuits.

DETAILED DESCRIPTION

Figure 1:
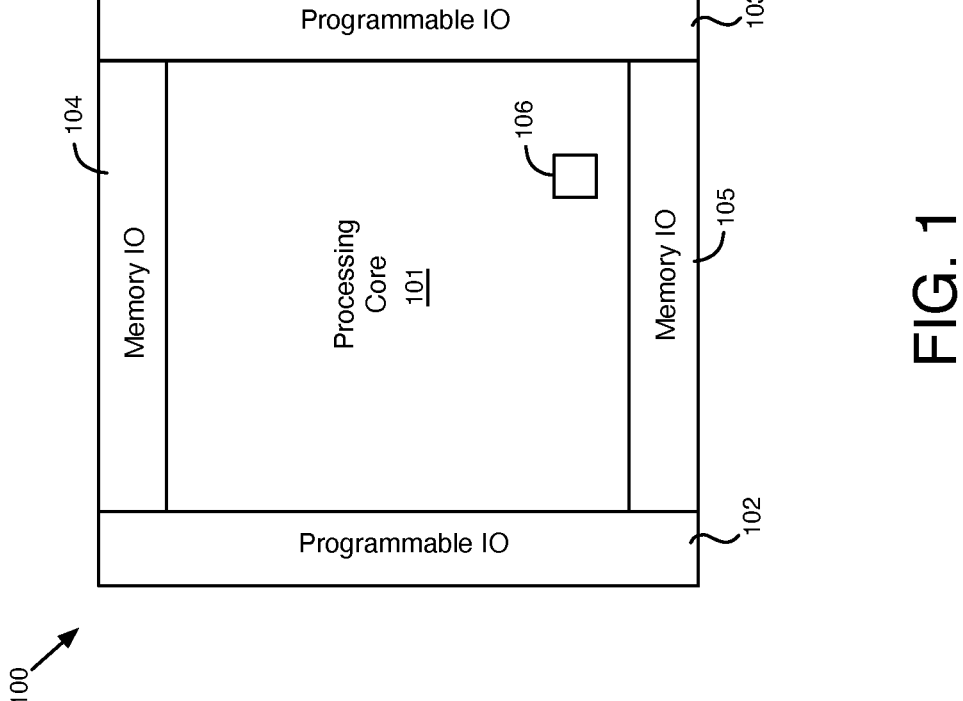
FIG. 1 is a diagram that illustrates a top down view of an example of a processing integrated circuit (IC) die that includes programmable input/output (IO) interface circuits and memory input/output (IO) interface circuits.

A server computer in a datacenter can include one or more processing devices. The processing devices may include, for example, central processing units, microprocessors, graphics processing units (GPUs), generic processing units (XPUs), etc. The processing devices are tasked to perform a pool of jobs/tasks, such as cryptography, end-to-end cloud computing, networking, storage, artificial intelligence, autonomous driving, virtual reality, augmented reality, gaming, and other data-centric applications.

As discussed herein, an integrated circuit (IC) may include hard logic and/or soft logic. As used herein, "hard logic" generally refers to circuits in an integrated circuit device that are not programmable by an end user of the IC. The circuits in an integrated circuit device that are programmable by the end user are referred to as "soft logic."

According to some examples disclosed herein, a processing integrated circuit (IC) die includes one or more memory input/output interfaces for communicating with one or more external memory devices and one or more programmable input/output interfaces for communicating with one or more external devices. The programmable input/output interfaces can be configurable to implement various input/output standards. The programmable input/output interfaces can be configurable to be used as input circuits, output circuits, or both. The processing IC die includes non-programmable logic circuits in a processing core that can communicate with one or more external devices through the programmable input/output interfaces according to various input/output standards. The programmable input/output interfaces can reduce new intellectual property (IP) development time for processing IC dies, and as a result, can provide a significant development cost savings. In addition, the programmable input/output interfaces can decouple validations for disaggregated circuit designs that are implemented in multiple IC dies. The programmable input/output interfaces can help with early IP enablement, product acceptance, and reduce Time To Market (TTM) for processing ICs.

In some examples disclosed herein, an infrastructure processing system (IPS) includes a processing integrated circuit (IC) die that has programmable input/output interfaces. The infrastructure processing system (IPS) can be, for example, a programmable network device that intelligently manages system-level infrastructure resources by securely performing functions in a datacenter. The IPS can perform infrastructure functions, including storage virtualization, network virtualization, and security with dedicated protocol processors. The IPS can free up processing cores by shifting storage and network virtualization functions that were previously performed in software on the processing cores to the IPS.

Throughout the specification, and in the claims, the term "connected" means a direct electrical connection between the circuits that are connected, without any intermediary devices. The term "coupled" means either a direct electrical connection between circuits or an indirect electrical connection through one or more passive or active intermediary devices. The term "circuit" may mean one or more passive and/or active electrical components that are arranged to cooperate with one another to provide a desired function.

One or more specific examples are described below. In an effort to provide a concise description of these examples, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

FIG. 1 is a diagram that illustrates a top down view of an example of a processing integrated circuit (IC) die 100 that includes programmable input/output (IO) interface circuits 102-103 and memory input/output (IO) interface circuits 104-105. The processing IC die 100 can be, for example, a microprocessor IC, a central processing unit (CPU), a graphics processing unit (GPU), or another type of processor IC. The processing IC die 100 includes a processing core 101. The processing core 101 includes non-programmable (hard) logic circuits, such as logic circuits 106, that are not programmable by an end user of processing IC die 100. Examples of non-programmable logic circuits that can be in processing core 101 include arithmetic logic units (ALUs), control logic, and registers. The ALUs can perform addition, subtraction, multiplication, division, and logic operations, such as AND, OR, NOR, NAND, XOR, etc. The control logic coordinates operation of the ALUs and other logic circuits in processing core 101. The registers can store instructions, interrupts, control states, etc.

The processing IC die 100 includes two programmable input/output (IO) interface circuits 102 and 103 adjacent to 2 opposite sides (left and right) of the IC die 100. The programmable input/output (IO) interface circuits 102-103 can, for example, include output buffers circuits and input buffer circuits that are configurable to transmit or receive signals through external terminals (e.g., pads, pins, bumps, etc.) of the IC 100 to or from external devices according to any communication protocol or standard. For example, programmable input/output interface circuits 102-103 can be configured to transmit signals according to a high bandwidth, high density interconnect protocol. The logic circuits in the processing core 101 of IC die 100 can communicate with external devices through the programmable IO interface circuits 102-103 according to any communication protocol or standard. The programmable IO interface circuits 102-103 can be configured by any suitable configuration circuitry that stores configuration bits for programming the states of the programmable IO interface circuits 102-103, such as fuses, random access memory (RAM) cells, latches, or other storage circuitry, that is located either in IC 100 or externally.

The programmable IO interface circuits 102-103 can, for example, include general-purpose input/output (GPIO) circuits. The GPIO circuits are input/output circuits on IC 100 that are coupled to external terminals (e.g., conductive pads, pins, bumps, etc.) of IC 100 and that are configurable to be used as input circuits, output circuits, or both. The GPIO circuits can, for example, include input and output buffer circuits. Each of the input buffers and output buffers in the GPIO circuits can, for example, be configurable to accept or source different logic voltages, with configurable drive current strengths and pull up/pull down currents. In these examples, the supply voltages, the input voltages, and/or the output voltages of the buffer circuits in the GPIO circuits can be configurable to different voltages. The GPIO circuits can also, for example, include double data rate input/output (DDIO) logic circuits that double or half the data rate of a communication channel. As another example, the GPIO circuits can include delay chains that are configurable to generate specific delays in signals and to assist in IO timing closure.

The processing IC die 100 also includes memory input/output (IO) interface circuits 104 and 105 adjacent to the top and bottom edges (sides) of the IC die 100. The non-programmable logic circuits (e.g., logic circuits 106) in the processing core 101 of IC die 100 communicate with external memory devices using the memory IO interface circuits 104-105. The memory IO interface circuits 104-105 can, for example, include input buffer circuits and output buffer circuits that are configured to process and transmit data, clock, and control signals according to any memory communications protocol or standard, such as Compute Express Link (CXL), Double Data Rate 4 Synchronous Dynamic Random-Access Memory (DDR4 SDRAM), Double Data Rate 5 Synchronous Dynamic Random-Access Memory (DDR5 SDRAM), or another version of a Double Data Rate (DDR) standard. An example of one or more of the external memory devices is disclosed herein with respect to FIG. 4.

Figure 2:
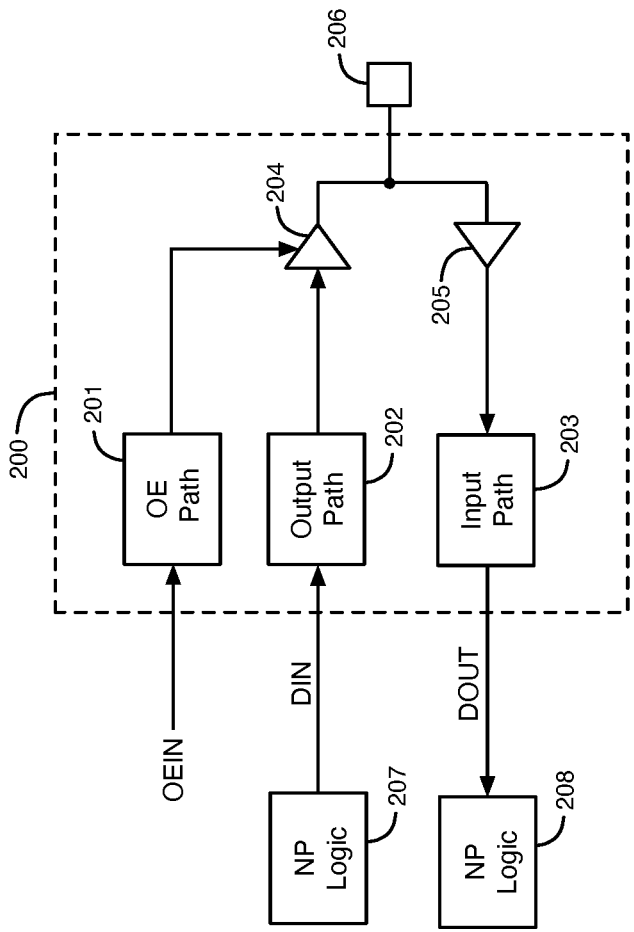
FIG. 2 is a diagram that illustrates an example of a general-purpose input/output (GPIO) circuit.

FIG. 2 is a diagram that illustrates an example of a general-purpose input/output (GPIO) circuit 200. The GPIO circuit 200 of FIG. 2 is an example of one or more programmable IO circuits in each of the programmable IO interface circuits 102-103 in IC die 100 of FIG. 1. GPIO circuit 200 includes an output enable path circuit 201, an output path circuit 202, an input path circuit 203, an output buffer circuit 204, and an input buffer circuit 205. GPIO circuit 200 is coupled to an external terminal 206 (e.g., a conductive pad, pin, bump, etc.) of the IC 100 containing GPIO circuit 200. GPIO circuit 200 is also coupled to two non-programmable logic circuits 207-208 in processing core 101. GPIO circuit 200 is configurable to be used as an input circuit, an output circuit, or both. GPIO circuit 200 can be configured as an input circuit by enabling input path circuit 203 and/or input buffer circuit 205.

In order to configure GPIO circuit 200 as an input circuit, an output enable signal OEIN is de-asserted, and the input path circuit 203 is enabled. The OE path circuit 201 transmits the output enable signal OEIN to an enable input of output buffer circuit 204. In response to the output enable signal OEIN being de-asserted, the output buffer circuit 204 is disabled. When GPIO circuit 200 is configured as an input circuit, input buffer circuit 205 transmits information indicated by an input signal (e.g., a data signal, a control signal, or a clock signal) received at external terminal 206 (e.g., from an external device) to input path circuit 203, and input path circuit 203 transmits the information received in a signal from input buffer circuit 205 to the non-programmable (NP) logic circuit 208 in processing core 101 as signals DOUT using configurable voltages, configurable drive current strengths, configurable data rates, configurable delays, etc.

In order to configure GPIO circuit 200 as an output circuit, the output enable signal OEIN is asserted, and the output path circuit 202 is enabled. When GPIO circuit 200 is configured as an output circuit, non-programmable (NP) logic circuit 207 in processing core 101 transmits input data signals DIN indicating information (e.g., data signals, control signals, and/or clock signals) to output path circuit 202, and output path circuit 202 transmits the information indicated by signals DIN to output buffer circuit 204 using configurable voltages, configurable drive current strengths, configurable data rates, configurable delays, etc. In response to the output enable signal OEIN being asserted, the output buffer circuit 204 is enabled. The output buffer circuit 204 then transmits the information received in one or more signals from output path circuit 202 to external terminal 206 for transmission to one or more external devices.

In order to configure both the input and output paths in the GPIO circuit 200, the output buffer circuit 204, the output path circuit 202, and the input path circuit 203 are enabled at the same time as discussed above. In this configuration, the output path circuit 202 transmits the information indicated by input signals DIN and received from NP logic circuit 207 to output buffer circuit 204. The output buffer circuit 204 transmits the information received from the output path circuit 202 to input buffer circuit 205. Input buffer circuit 205 transmits the information received from output buffer circuit 204 to input path circuit 203. Input path circuit 203 then transmits the information received from input buffer circuit 205 to NP logic circuit 208 as signals DOUT.

Figure 3:
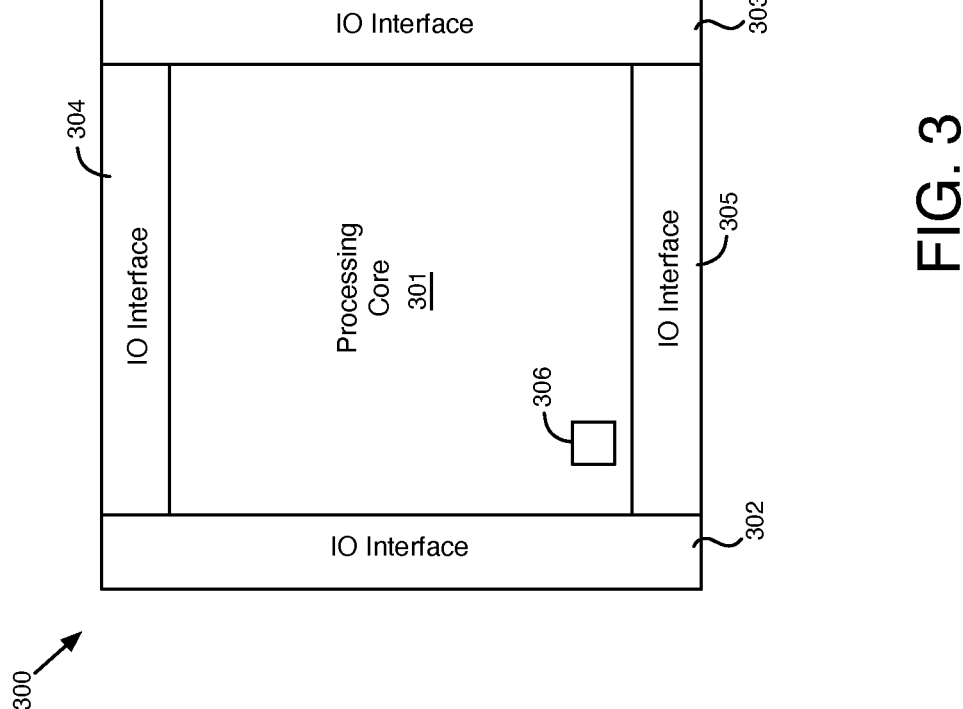
FIG. 3 is a diagram that illustrates a top down view of an example of a processing integrated circuit (IC) die that includes four input/output (IO) interface circuits.

FIG. 3 is a diagram that illustrates a top down view of an example of a processing integrated circuit (IC) die 300 that includes 4 input/output (IO) interface circuits 302-305 adjacent to 4 sides of the die 300. The processing IC die 300 can be, for example, a microprocessor IC, a central processing unit (CPU), a graphics processing unit (GPU), or another type of processor IC. The processing IC die 300 includes a processing core 301 that includes non-programmable (hard) logic circuits, such as logic circuits 306, that are not programmable by an end user of processing IC die 300.

The 4 input/output (IO) interface circuits 302-305 in processing IC die 300 are adjacent to the 4 sides of the IC die 300 and are coupled to external terminals of IC die 300. IO interface circuits 302-305 can include one or more of memory IO interface circuits, programmable IO interface circuits, or other types of IO interface circuits. According to various examples, one, two, three, or all four of the IO interface circuits 302, 303, 304, or 305 can include one or more programmable IO interface circuits, such as GPIO circuits. The GPIO circuit 200 of FIG. 2 is an example of a programmable IO interface circuit that can be in one, two, three, or all four of the IO interface circuits 302-305. In some examples, one or more of the IO interface circuits 302-305 can each include two or more programmable IO interface circuits, such as two or more GPIO circuits 200. The logic circuits in the processing core 301, such as logic circuits 306, can communicate with external devices through the programmable IO interface circuits in IC die 300 according to any communication protocol or standard.

Figure 4:
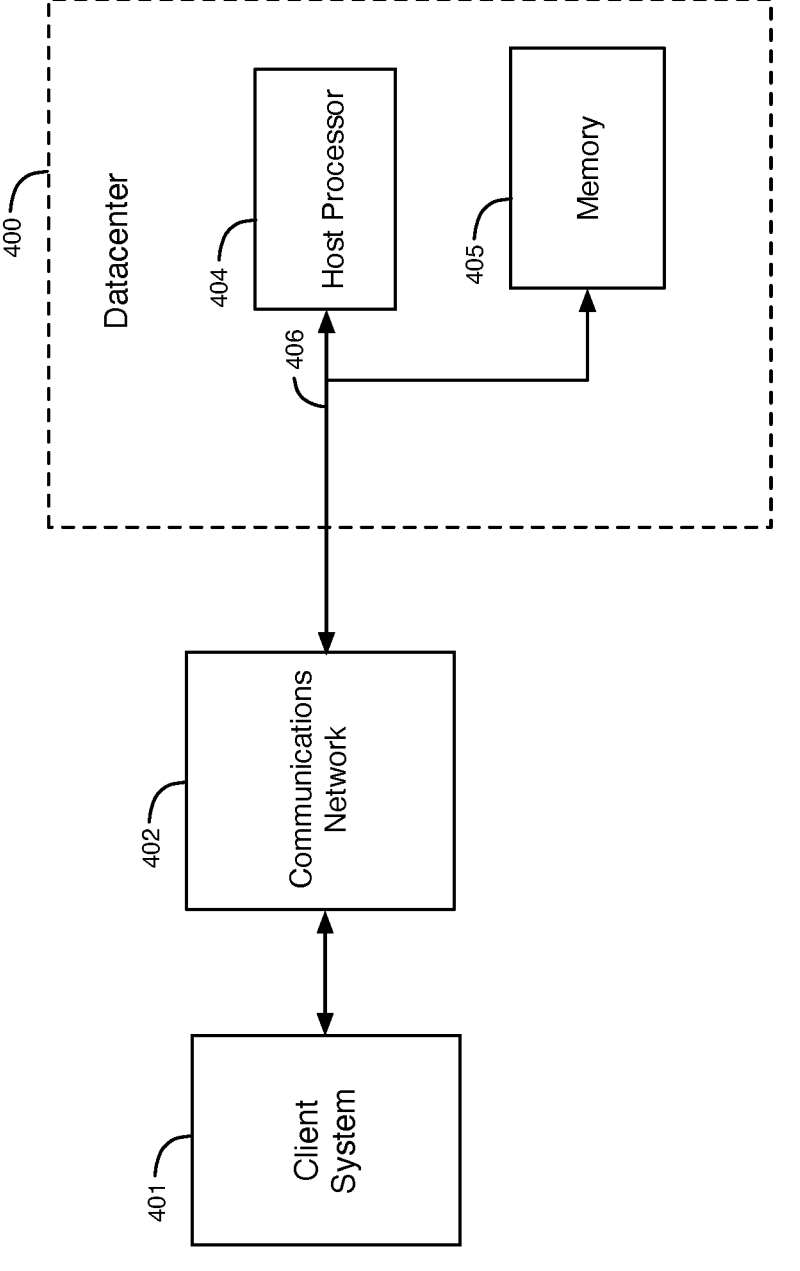
FIG. 4 is a diagram that illustrates examples of a datacenter, a communications network, and a client system.

FIG. 4 is a diagram that illustrates examples of a data-center 400, a communications network 402, and a client system 401. Datacenter 400 includes a host processor 404 and one or more external memory devices 405 (e.g., in a server computer or other device). The processing IC die 100 and the processing IC die 300 are examples of the host processor 404. The external memory devices 405 can be any of the external memory devices discussed above with respect to FIGS. 1-3. The host processor 404 can communicate with the external memory devices 405 through interconnects 406 using the memory IO interfaces in the host processor 404, as discussed above.

The client system 401 transmits packets of data to the host processor 404 through the communications network 402 and through interconnects 406. The host processor 404 can communicate with the client system 401 using the programmable IO interfaces discussed above. The host processor 404 processes the packets of data to generate processed packets of data. The processed packets of data can be transmitted from host processor 404 to memory devices 405 through interconnects 406.

In general, software and data for performing any of the functions disclosed herein may be stored in non-transitory computer readable storage media. Non-transitory computer readable storage media is tangible computer readable storage media that stores data for later access, as opposed to media that only transmits propagating electrical signals (e.g., wires). The software code may sometimes be referred to as software, data, program instructions, instructions, or code. The non-transitory computer readable storage media may, for example, include computer memory chips, non-volatile memory such as non-volatile random-access memory (NVRAM), one or more hard drives (e.g., magnetic drives or solid state drives), one or more removable flash drives or other removable media, compact discs (CDs), digital versatile discs (DVDs), Blu-ray discs (BDs), other optical media, and floppy diskettes, tapes, or any other suitable memory or storage device(s).

Additional examples are now described. Example 1 is a processing integrated circuit comprising: a processing core comprising hard logic circuits; and a first programmable interface circuit that is configurable to exchange signals between a first external terminal of the processing integrated circuit and the hard logic circuits.

In Example 2, the processing integrated circuit of Example 1 may optionally include, wherein the first programmable interface circuit comprises a general purpose input and output circuit.

In Example 3, the processing integrated circuit of any one of Examples 1-2 further comprises: a second programmable interface circuit, wherein the second programmable interface circuit is configurable to exchange signals between a second external terminal of the processing integrated circuit and the hard logic circuits.

In Example 4, the processing integrated circuit of Example 3 may optionally include, wherein the first programmable interface circuit is adjacent to a first edge of the processing integrated circuit, and wherein the second programmable interface circuit is adjacent to a second edge of the processing integrated circuit.

In Example 5, the processing integrated circuit of any one of Examples 1-4 further comprises: a memory input and output interface circuit, wherein the hard logic circuits are coupled to exchange signals with an external memory device through the memory input and output interface circuit and a second external terminal of the processing integrated circuit.

In Example 6, the processing integrated circuit of any one of Examples 1-5 may optionally include, wherein the first programmable interface circuit comprises: an input buffer circuit that transmits an input signal from the first external terminal to the hard logic circuits when the first programmable interface circuit is configured to function as an input circuit.

In Example 7, the processing integrated circuit of any one of Examples 1-6 may optionally include, wherein the first programmable interface circuit comprises: an output buffer circuit that transmits an output signal from the hard logic circuits to the first external terminal when the first programmable interface circuit is configured to function as an output circuit.

In Example 8, the processing integrated circuit of Example 7 may optionally include, wherein the first programmable interface circuit further comprises: an output enable circuit that is configurable to enable the output buffer circuit.

In Example 9, the processing integrated circuit of any one of Examples 1-8 may optionally include, wherein the first programmable interface circuit is configurable to function as at least one of an input circuit or as an output circuit.

Example 10 is a method for using a processing integrated circuit, the method comprising: configuring a first programmable interface circuit in the processing integrated circuit to provide information from a first non-programmable logic circuit in a processing core of the processing integrated circuit to a first external terminal of the processing integrated circuit; and configuring the first programmable interface circuit to provide information from the first external terminal to a second non-programmable logic circuit in the processing core of the processing integrated circuit.

In Example 11, the method of Example 10 further comprises: configuring the first programmable interface circuit to provide information from the first non-programmable logic circuit to the second non-programmable logic circuit.

In Example 12, the method of any one of Examples 10-11 further comprises: configuring a second programmable interface circuit in the processing integrated circuit to provide information from a third non-programmable logic circuit in the processing core of the processing integrated circuit to a second external terminal of the processing integrated circuit.

In Example 13, the method of Example 12 further comprises: configuring the second programmable interface circuit to provide information from the second external terminal to a fourth non-programmable logic circuit in the processing core.

In Example 14, the method of any one of Examples 10-13 may optionally include, wherein configuring the first programmable interface circuit to provide information from the first non-programmable logic circuit to the first external terminal further comprises configuring an output path circuit to provide information from the first non-programmable logic circuit to the first external terminal through an output buffer circuit coupled to the first external terminal.

In Example 15, the method of any one of Examples 10-14 may optionally include, wherein configuring the first programmable interface circuit to provide information from the first external terminal to the second non-programmable logic circuit further comprises configuring an input path circuit to provide information from an input buffer circuit coupled to the first external terminal to the second non-programmable logic circuit.

Example 16 is a microprocessor integrated circuit comprising: a processing core comprising first and second hard logic circuits; and a first programmable input and output interface circuit that is configurable to transmit information from a first external terminal of the microprocessor integrated circuit to the first hard logic circuit, wherein the first programmable input and output interface circuit is further configurable to transmit information from the second hard logic circuit to the first external terminal.

In Example 17, the microprocessor integrated circuit of Example 16 further comprises: a second programmable input and output interface circuit that is configurable to transmit information from a second external terminal of the microprocessor integrated circuit to a third hard logic circuit in the processing core, wherein the second programmable input and output interface circuit is further configurable to transmit information from a fourth hard logic circuit in the processing core to the second external terminal.

In Example 18, the microprocessor integrated circuit of any one of Examples 16-17 may optionally include, wherein the first programmable input and output interface circuit is configurable to provide information from the first hard logic circuit to the second hard logic circuit.

In Example 19, the microprocessor integrated circuit of any one of Examples 16-18 may optionally include, wherein the first programmable input and output interface circuit comprises a general purpose input and output circuit, and wherein the general purpose input and output circuit comprises an input buffer circuit coupled to the first external terminal and an output buffer circuit coupled to the first external terminal.

In Example 20, the microprocessor integrated circuit of any one of Examples 16-19 further comprises: a memory input and output interface circuit, wherein the first and the second hard logic circuits are coupled to exchange signals with an external memory device through the memory input and output interface circuit and a second external terminal of the microprocessor integrated circuit.

The foregoing description of the examples has been presented for the purpose of illustration. The foregoing description is not intended to be exhaustive or to be limiting to the examples disclosed herein. In some instances, features of the examples can be employed without a corresponding use of other features as set forth. Many modifications, substitutions, and variations are possible in light of the above teachings.

What is claimed is:
1. A processing integrated circuit comprising:
a processing core comprising hard logic circuits;

a first programmable interface circuit that is configurable to exchange first signals between a first external terminal of the processing integrated circuit and the hard logic circuits; and
a second programmable interface circuit that is configurable to exchange second signals between a second external terminal of the processing integrated circuit and the hard logic circuits, wherein the first programmable interface circuit is adjacent to a first edge of the processing integrated circuit, and wherein the second programmable interface circuit is adjacent to a second edge of the processing integrated circuit.

2. The processing integrated circuit of claim 1, wherein the first programmable interface circuit comprises a general purpose input and output circuit.

3. The processing integrated circuit of claim 1 further comprising:
a third programmable interface circuit, wherein the third programmable interface circuit is configurable to exchange third signals between a third external terminal of the processing integrated circuit and the hard logic circuits.

4. The processing integrated circuit of claim 3, wherein the third programmable interface circuit is adjacent to a third edge of the processing integrated circuit.

5. The processing integrated circuit of claim 1 further comprising:
a memory input and output interface circuit, wherein the hard logic circuits are coupled to exchange third signals with an external memory device through the memory input and output interface circuit.

6. The processing integrated circuit of claim 1, wherein the first programmable interface circuit comprises:
an input buffer circuit that transmits an input signal from the first external terminal to the hard logic circuits when the first programmable interface circuit is configured to function as an input circuit.

7. The processing integrated circuit of claim 1, wherein the first programmable interface circuit comprises:
an output buffer circuit that transmits an output signal from the hard logic circuits to the first external terminal when the first programmable interface circuit is configured to function as an output circuit.

8. The processing integrated circuit of claim 7, wherein the first programmable interface circuit further comprises:
an output enable circuit that is configurable to enable the output buffer circuit.

9. The processing integrated circuit of claim 1, wherein the first programmable interface circuit is configurable to function as at least one of an input circuit or an output circuit.

10. A method for using a processing integrated circuit, the method comprising:
configuring a first programmable interface circuit in the processing integrated circuit to provide first information from a first non-programmable logic circuit in a processing core of the processing integrated circuit to a first external terminal of the processing integrated circuit;
configuring the first programmable interface circuit to provide second information from the first external terminal to a second non-programmable logic circuit in the processing core of the processing integrated circuit; and configuring the first programmable interface circuit to provide third information from the first non-programmable logic circuit to the second non-programmable logic circuit.

11. The method of claim 10 further comprising:

exchanging signals between the first and the second non-programmable logic circuits and an external memory device through a memory input and output interface circuit in the processing integrated circuit.

12. The method of claim 10 further comprising:

configuring a second programmable interface circuit in the processing integrated circuit to provide fourth information from a third non-programmable logic circuit in the processing core of the processing integrated circuit to a second external terminal of the processing integrated circuit.

13. The method of claim 12 further comprising:

configuring the second programmable interface circuit to provide fifth information from the second external terminal to a fourth non-programmable logic circuit in the processing core.

14. The method of claim 10, wherein configuring the first programmable interface circuit to provide the first information from the first non-programmable logic circuit to the first external terminal further comprises configuring an output path circuit to provide the first information from the first non-programmable logic circuit to the first external terminal through an output buffer circuit coupled to the first external terminal.

15. The method of claim 10, wherein configuring the first programmable interface circuit to provide the second information from the first external terminal to the second non-programmable logic circuit further comprises configuring an input path circuit to provide the second information from an input buffer circuit coupled to the first external terminal to the second non-programmable logic circuit.

16. A microprocessor integrated circuit comprising:

a processing core comprising first and second hard logic circuits;

a first programmable input and output interface circuit that is configurable to transmit first information from a first external terminal of the microprocessor integrated circuit to the first hard logic circuit, wherein the first programmable input and output interface circuit is further configurable to transmit second information from the second hard logic circuit to the first external terminal; and a memory input and output interface circuit, wherein the first and the second hard logic circuits are coupled to exchange signals with an external memory device through the memory input and output interface circuit and a second external terminal of the microprocessor integrated circuit.

17. The microprocessor integrated circuit of claim 16 further comprising:

a second programmable input and output interface circuit that is configurable to transmit third information from a third external terminal of the microprocessor integrated circuit to a third hard logic circuit in the processing core, wherein the second programmable input and output interface circuit is further configurable to transmit fourth information from a fourth hard logic circuit in the processing core to the third external terminal.

18. The microprocessor integrated circuit of claim 16, wherein the first programmable input and output interface circuit is configurable to provide third information from the first hard logic circuit to the second hard logic circuit.

19. The microprocessor integrated circuit of claim 16, wherein the first programmable input and output interface circuit comprises a general purpose input and output circuit, and wherein the general purpose input and output circuit comprises an input buffer circuit coupled to the first external terminal and an output buffer circuit coupled to the first external terminal.

20. The microprocessor integrated circuit of claim 17, wherein the first programmable input and output interface circuit is adjacent to a first edge of the microprocessor integrated circuit, and wherein the second programmable input and output interface circuit is adjacent to a second edge of the microprocessor integrated circuit.

* * * * *